United States Patent [19]

Bert

[11] 4,424,495

[45] Jan. 3, 1984

[54] RADIO POWER DISTRIBUTOR AND RADIO EQUIPMENT USING SUCH A DISTRIBUTOR, PARTICULARLY IN THE SOLID STATE

[75] Inventor: Alain Bert, Paris, France

[73] Assignee: Thomson-CSF, Paris, France

[21] Appl. No.: 218,101

[22] Filed: Dec. 19, 1980

[30] Foreign Application Priority Data

Jan. 15, 1980 [FR] France ............................... 80 00845

[51] Int. Cl.[3] ............................................... H03F 3/60

[52] U.S. Cl. ....................................... 330/286; 330/54

[58] Field of Search .......................... 330/54, 286, 287

[56] References Cited

U.S. PATENT DOCUMENTS 3,742,392 6/1973 Schwarzmann .

3,963,993 6/1976 Hoffman et al. .................... 330/286

3,967,218 6/1976 McGowan .

FOREIGN PATENT DOCUMENTS 2419173 10/1975 Fed. Rep. of Germany .

2837817 3/1979 Fed. Rep. of Germany .

2101207 3/1972 France .

1235472 6/1971 United Kingdom .

OTHER PUBLICATIONS

"1978 IEEE MTT-S International Microwave Symposium Digest", 27-29 Jun. 1978, W. C. TSAI, A 5 Watt C-Band FET Amplifier, pp. 285-287.

*Primary Examiner*—James B. Mullins

*Assistant Examiner*—Gene Wan

*Attorney, Agent, or Firm*—Roland Plottel

[57] ABSTRACT

The invention relates to a radio power distributor. The distributor comprises a plurality of dividers D(i−1), D(i) . . . mounted in cascade-like manner and each having a primary branch A(i−1, A(i) . . . which is divided up into secondary branches, whereof one, the main secondary branch B(i−1) is connected to the primary branch A(i) of the following and whereof the others (C) are terminated on the utilization points. All the branches (C) are connected to the same point a of the line B of the same rank i by resistance members. This makes it possible to absorb the reflected powers in these lines when mismatchings occur, even when the latter are identical. A phase changer $\phi$ is optionally placed in the primary branch.

13 Claims, 11 Drawing Figures

PRIOR ART

RADIO POWER DISTRIBUTOR AND RADIO EQUIPMENT USING SUCH A DISTRIBUTOR, PARTICULARLY IN THE SOLID STATE

BACKGROUND OF THE INVENTION

The invention relates to a power distributor for radio waves. It more particularly relates to variants of such a distributor in solid state form for use at ultra-high frequencies. It also relates to equipment using one or more such distributors.

Power dividing and recombining circuits are used whenever it is desired, for example, to add the powers of several independent amplifiers, particularly when it is necessary to have a power level higher than that supplied by the existing amplifiers.

The hitherto proposed circuits do not generally satisfy what is considered to be a fundamental condition, namely that of permitting an appropriate operation, even in the presence of identical mismatchings in connection with the charges of different branches or channels of the divider, e.g. transistors in high frequency amplifiers. In the case of such amplifiers, every effort has been made to obtain an operation in an as wide as possible frequency range and in which such mismatchings generally occur.

There are in fact two types of mismatchings, the first resulting from the variation in the impedance of each elementary amplifier as a result of the displacement of the apparatus frequency, whilst the second, at a given frequency, results from disparities between amplifiers in one and the same batch.

Within the scope of the invention, the greatest interest is attached to the first-mentioned type, which are much more important than the naturally occurring manufacturing variations in the present state of the art. Thus, it is a question of mismatchings of a symmetrical nature where all the components charging the branches are assumed to be initially identical and then vary in the same way as a function of the frequency, the variations between components of the same batch being considered as of a secondary nature, compared with the first-mentioned type.

In general terms, the excess power, namely that reflected by the mismatched component is absorbed in a resistive member mounted between the branches of the distributor.

In the branches of a divider, like that referred to hereinbefore, according to the prior art said resistors were connected in parallel on each of the branches of the divider and to a certain extent in a symmetrical manner with respect to these branches. Thus, the system, regulated for an initial zero absorption state, only ensured the sought absorption function in the case of an asymmetrical unbalance between the branches, i.e. particularly random mismatchings of the branches, like those resulting from dissimilarities between amplifiers.

However, such an arrangement was not suitable for absorbing the power imposed by a symmetrical mismatching of the branches.

BRIEF SUMMARY OF THE INVENTION

The invention relates to a power distributor, which, unlike the prior art, is able to make up for the unbalances, even when they are symmetrical with its branches, particularly in the case of impedance variations in the active components which load the latter when the frequency is displaced. To an even greater extent, such a distributor can make up for the non-symmetrical unbalances which may occur.

BRIEF DESCRIPTION OF THE DRAWINGS

The invention is described in greater detail hereinafter relative to non-limitative embodiments and the attached drawings, wherein show:

FIG. 10 is a perspective view of the recombining portion II of the embodiment of FIG. 5 showing the microband technology on a substrate.

FIG. 11 is a schematic drawing of the equivalent electrical circuit of FIG. 10.

In the different Figs. like elements bear like legends.

DETAILED DESCRIPTION OF THE PREFERRED EMBODIMENTS

Figure 1:
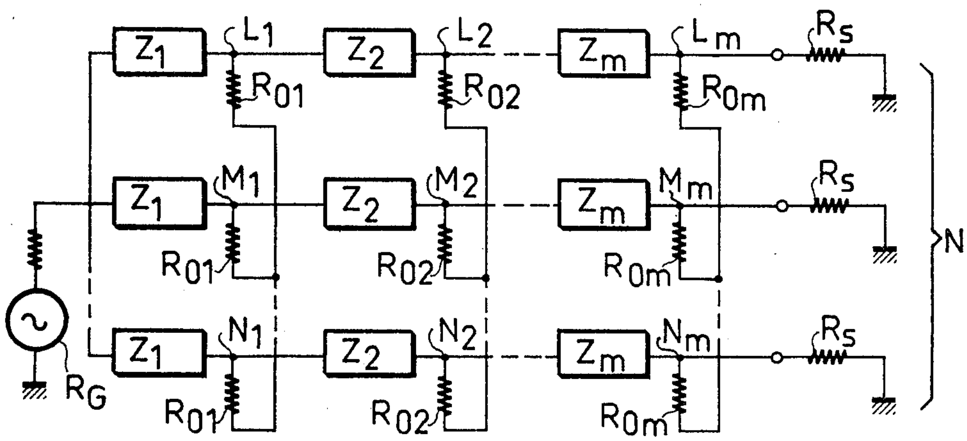
FIG. 1 diagrammatically, a prior art dividing circuit.

All the dividers according to FIG. 1 are based on the Wilkinson circuit described in the article in IRE Trans. MTT3, p.116, January 1960. The diagram shows the case of power division from a high frequency generator $R_G$ delivering on N branches, each charged by the same load impedance $R_s$.

Each line has m impedance sections $Z_1, Z_2 \ldots Z_m$ between which are connected in parallel, in the manner shown in the drawing, dissipative members, $R_{01}, R_{02} \ldots R_{0m}$. All these branches are shown to be identical, although in reality there are minor unimportant differences between them. In the case of ultra-high frequencies, the impedance sections $Z_1, Z_2 \ldots Z_m$ are coaxial line sections, for example quarter wave sections, i.e. whose length is equal to quarter the average wavelength of the high frequency operating wave supplied by generator $R_G$.

The operating frequency band of the device increases in width as the number m increases, everything else being equal. This being the case, a brief analysis is given below of the behaviour of the device in the case of equal mismatchings of loads $R_s$.

As the device is provided for given initial conditions as described hereinbefore, i.e. with N branches formed from m line sections, which are all identical to one another (same impedances $Z_1 \ldots Z_m$), same dissipative elements $R_{01} \ldots R_{0m}$ and same loads $R_s$ and regulated in such a way that the loads $R_s$ are perfectly matched, no power is reflected in the branches in which the points located at the same distance from the source, such as $L_1$, $M_1$, $N_1$ are in phase on all the lines. Thus, no energy is dissipated in the resistive members placed in bridge-like manner between the lines. This is not the case if unequal matchings occur in the branches, because this phase balance is no longer retained and a current passes between the points such as $L_1$, $M_1$, $N_1$, $L_2$, $M_2$, $N_2$, etc.

However, in the case of symmetrical mismatchings of loads $R_s$, all the identical lines undergo the same disturbances and points $L_1,M_1,N_1$ are in phase, as are $L_2,M_2,N_2$, etc in the same way at the time of the initial setting. Under these conditions, the supplementary powers reflected by the mismatched loads cannot be absorbed by the resistors, at whose terminals no potential difference appears. Thus, there are numerous variants to the Wilkinson circuit described hereinbefore, but no further reference will be made thereto because, as they are all based on the same principle, they all have the same disadvantages.

Reference is also made to Lange, IEEE Trans MTT 17, December 1969, p.1150 as prior art for power distributors. Reference is also made to U.S. Pat. Nos. 3,593,174 and 3,963,993 in the name of Marvin H. White and Gary H. Hoffmann respectively.

To obviate these problems, the invention provides an arrangement which permanently ensures, i.e. whatever the state of the loads, a phase displacement permitting the desired absorption. According to the invention, the distributor has a plurality of dividers arranged in cascade form, each of them being connected by an output branch to the next. Each of them also has at its output, a certain number of branches to which loads are connected.

The term secondary branch is used for all these branches, including those serving for the connection to the following divider and those closed on the loads, the first-mentioned being the said main secondary branch. According to the invention, this branch is connected to the input branch in the following divider, called the primary branch across optionally a phase changer. This divider also has a secondary branch, the main secondary branch being connected to the primary branch of the following divider, optionally across a phase changer, etc.

Figure 2:
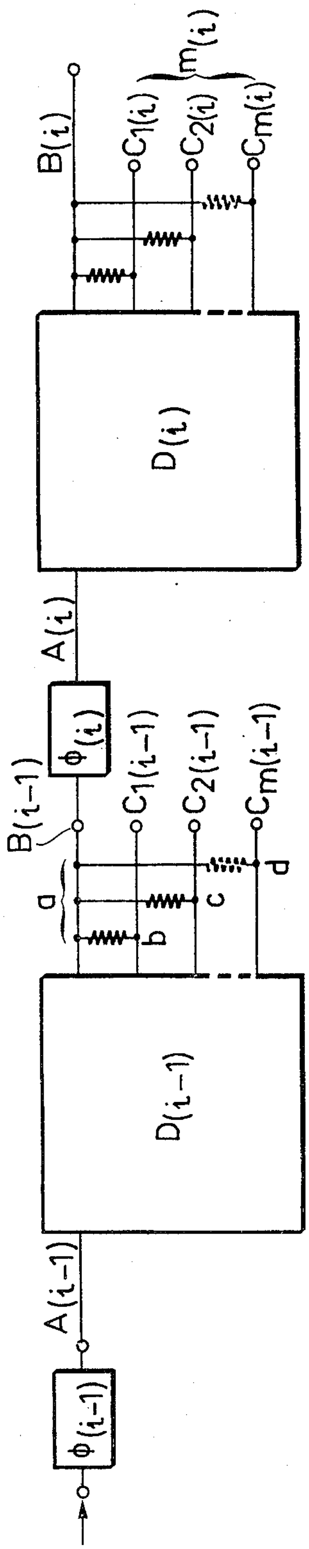
FIG. 2 a dividing circuit according to the invention.

FIG. 2 is the general diagram of the distributor according to the invention limited to two dividers D(i−1) and D(i), showing the main secondary branches at B(i−1) and B(i), the other secondary branches at $C_1$(i−1) . . . $C_m$(i−1) and $C_1$(i) . . . $C_m$(i), with the primary branches A(i−1) and A(i) and the phase changers $\phi$(i−1) and $\phi$(i) designated by the same letter as the phase change which they introduce on the primary branch to which they are connected. A system of resistive members, given no numeral for reasons of clarity, is used as in the prior art in the manner described in FIG. 1. These members connect the secondary branches C1, C2, CM to the main secondary branch B in star-like manner in the present case, but any other arrangement is possible within the scope of the invention. Finally, each of these dividers introduces a phase displacement called $\phi_D$ with the rank index i, as for the remainder of the aforementioned members.

As stated hereinbefore, the loads are connected to the ends of the secondary branches, in accordance with the optimum distribution for the intended use of the distributor. In the example of FIG. 2, these loads are distributed in equal numbers at the output from the dividers. However, any other arrangement can be envisioned in which m would not have the same value for all the dividers.

In operation, the device is first set, including the phase shifter $\phi$(i), in such a way that for substantially zero reflections in the secondary branches the absorption is negligible in the resistive members. When the loads on which the secondary branches C are connected to their respective loads mismatched and substantially all of the same quantity, the phase variations introduced between the outputs of successive dividers produces the result that the reflected waves in the main secondary branch B(i) and in the other secondary branches C(i) are not in phase. A potential difference then appears between point a on the one hand and points b, c and d on the other and an absorption of reflected power in resistive members is made possible. Thus, identical load variations in the branches of the distributor are made possible without disturbing operation, contrary to what was the case in the prior art.

Figure 3:
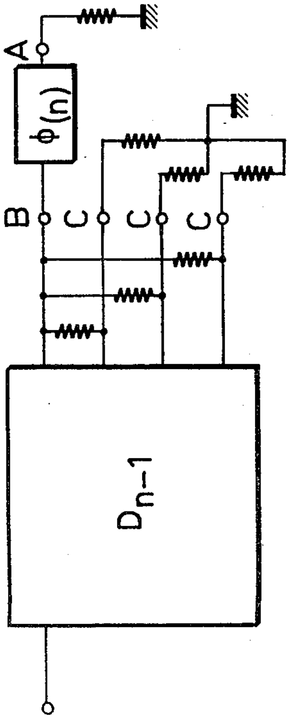
FIGS. 3 and 4 additional information regarding the diagram of FIG. 2.
Figure 4:
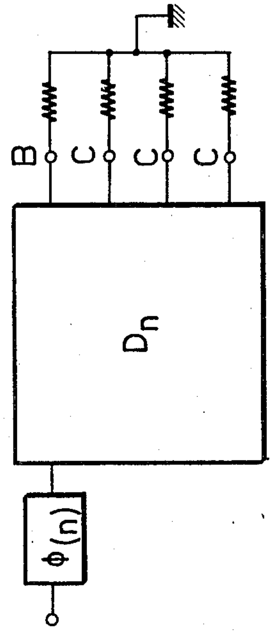

The structure is terminated (i=n) by connecting the main branch to a load. Two arrangements are possible: in the first a phase shifter $\phi \neq 0$ is preferably introduced in the manner indicated hereinbefore $\phi=(2K+1)(\pi/2)$ between A and the main secondary branch B of the final divider, the other secondary branches being all connected to other loads; or all the secondary branches of the final divider, including the main secondary branch are directly connected to loads: cf FIGS. 3 and 4 where all the other secondary branches are designated by C without differentiation.

Thus, the distributor according to the invention appears as a progressive structure formed from a succession of dividers, whose phases are displaced with respect to one another.

Reference has been made to phase and that in order that in the absence of reflections in the line no current circulates in the resistive members, it is also necessary to have an amplitude ratio between the voltages appearing at insertion points a, b, c and d. This ratio is $P_0R_0=P_{(i)}R_{(i)}(1)$ if $R_{(i)}$ and $R_0$ designate the characteristic impedances of the main secondary line and that of all the other secondary lines, and $P_{(i)}$ and $P_0$ are the high frequency powers in said lines.

The total phase displacement between a secondary branch C(i) and a secondary branch C(i−1) is $\phi(i)+\phi_D(i)$ with the aforementioned notations; where $\phi$D(i) is the phase displacement of the divider D(i).

The phase displacement is obviously only effective if the sum differs from $k\pi$, which is always easy to obtain. Thus, it is possible to take $\phi(i)+\phi_D(i)=(2k+1)(\pi/2)$.

In this case, the reflected power is absorbed in the resistive members and it can be ensured that a collective mismatching of loads has no influence upon the reflection coefficient at the input, to the left in FIG. 2; the drawing of FIG. 2 shows a distributor used as a divider for a source whose power arrives in the direction of the arrow.

This characteristic is particularly advantageous in the case where the useful loads are transistors used for amplification on a wide pass band. Thus, it is known that the gain of a transistor decreases by approximately 6 dB per octave as a function of the frequency. At the lowest frequencies of the range, there is consequently a gain surplus and it is advantageous to reduce the input power by this amount. This result is obtained either by introducing selective losses in the input circuit, or by bringing about a voluntary mismatching at the bottom of the band. The latter solution is simpler, but it is appropriate to absorb the thus reflected power. The structure according to the invention makes it possible to obtain this result in a particularly simple manner, even in the case of a large number of transistors and over a wide pass band. The individual mismatchings are also absorbed in the same way as in a in-phase divider.

Figure 5:
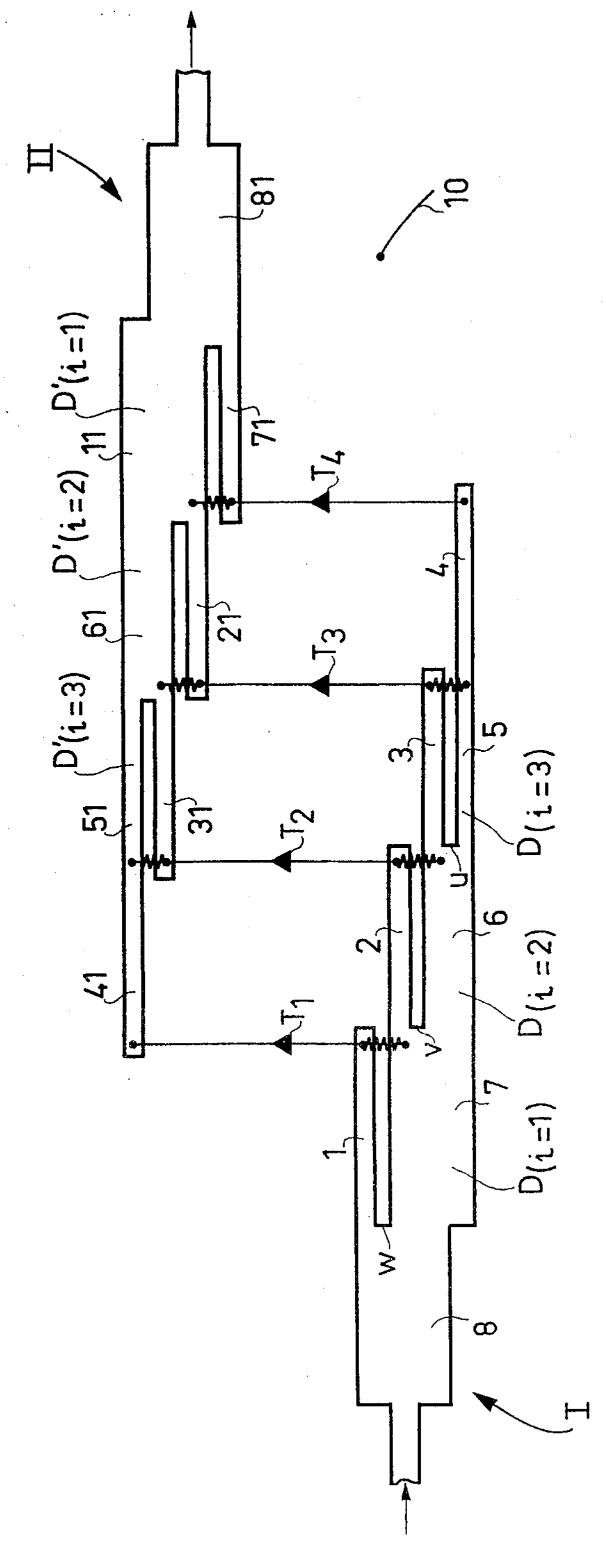
FIG. 5 an amplifier using the distributor according to the invention constructed on the basis of microband technology.

Hitherto, reference has mainly been made to the construction according to the invention when used as a power divider. Obviously, it can also be used as a power recombining means, provided that the different power sources have appropriate relative phases. This condition can be ensured, in the case of an amplifier, due to the distribution of the input powers by means of a divider of the same type. Then two distributors according to the invention are used one acting as a divider and the other as a recombiner. FIG. 5 shows an exemplified embodiment in microband technology. FIG. 5 is a plan view of the useful part of the insulating substrate 10 on which the transmission lines are in the form of linear conductors applied to the said substrate whose opposite face is coated with metal. This is an amplifier for ultra-high frequencies with four distributed active elements consisting of four transistors $T_1$, $T_2$, $T_3$ and $T_4$. In the present embodiment, these separately manufactured elements are joined to the substrate.

In the example of the drawing, there are two distributors according to the invention designated overall by I and II. The first of them functions as a divider of power towards the transistors $T_1$ to $T_4$ from a not shown source located at the input of part I (arrow), and the second functions as a recombining means for the power on leaving the four transistors. Each of them has three phase dividers such as D(i) in the previous drawings with two secondary branches each, including the main secondary branch and only one other secondary branch (m(i) in the previous drawings is therefore equal to 1) and a terminal line.

For system I, these dividers carry reference letter D as hereinbefore and are constituted by lines (1, 7), (2, 6) and (3, 5), as shown in the drawing. The terminal line 4 is loaded by the final transistor. In accordance with conventional microstrip technology, the lines 1,7; 2,6; and 3,5 are constituted by U-shaped conductors. The bottom of the U being positioned level with the end of the branches of the preceding U and its upper branch 1, 2, 3, is in the extension of the lower branch 8, 7, and 6 of the latter and in contact therewith. Drawing shows the positioning of the resistive members, not indicated by reference numerals. Similar references are given to system II with the necessary changes to obviate any confusion. In system II the dividers comprise aligned U-shaped conductors of an alumina substrate 100 as shown in FIG. 10. The bottom of AU being positioned level with the end of the branches of the following U, and its lower branch 31, 32, 71 is in the extension of the upper branch 81, 11, 61 of the latter and in contact therewith. The recombined power leaves in the direction of the arrow. The resistive elements provided between adjacent conductors to produce absorption of the reflected power are also made by conventional thin film as shown in FIG. 10.

The phase displacement $\phi(i)+\phi_D(i)$ is in the present example equal to $(\pi/2)$ by the use of lines 1, 2, 3, 4, or 71, 21, 31, 41 of lengths equal to a quarter wave for the centre frequency, giving $\phi(i)=0$ because for each divider the point B(i−1) of the diagram of FIG. 2 coincides with point A(i): points u, v, w in the drawing. The characteristic impedances of these lines are all 50 Ohms. However, the impedances of lines 5, 6 and 7, or 51, 61, and 11 are not equal to one another and are respectively 50, 25 and 16.6 Ohms to satisfy condition 1 as shown schematically in FIG. 11.

Figure 6:
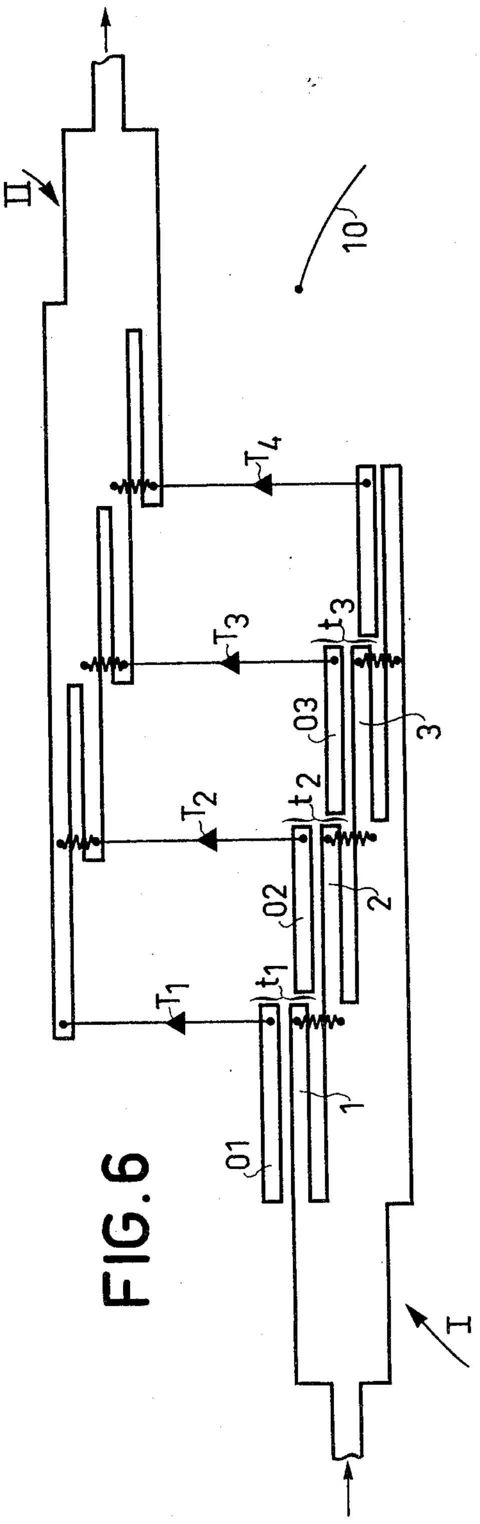
FIG. 6 a variant of the previous drawing.

However, it often arises that the impedances of the active elements such as $T_1T_2T_3T_4$ are very low (a few Ohms) and that matching at 50 Ohms is difficult. FIG. 6 gives a variant of the arrangement of the previous drawing, which is particularly suitable in this case where, in each divider an impedance transformer is provided on the secondary branch. In the drawing, these transformers are referenced $t_1$, $t_2$, $t_3$. Each of them has a second line 01, 02, 03 coupled to the secondary lines 1, 2 and 3.

Figure 7:
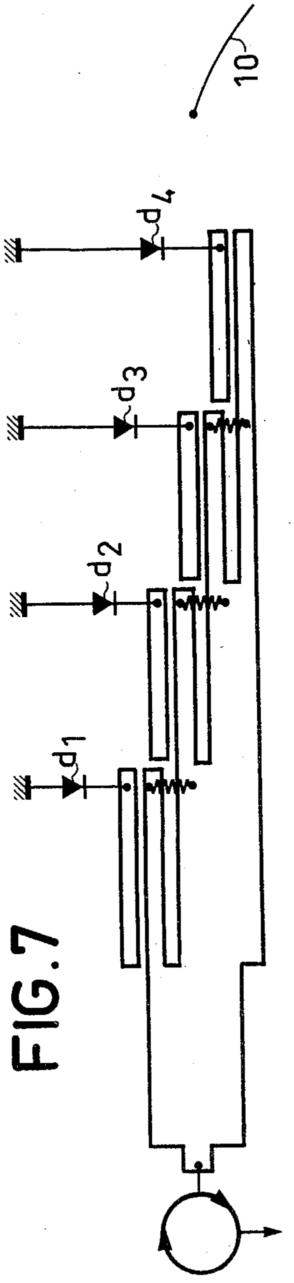
FIG. 7 a view of another construction in the same technology.

FIG. 7 shows, once again in microband technology, another example of the use of the distributor according to the invention in the addition of the powers of several negative resistance diodes. In this case, impedance transformers are once again used.

The output power is collected in the direction of the arrow on a frequency fixed by a locking signal by means of a circulator (circle arrow) the frequency being for example approximately 10 to 20 gigahertz. The diodes are referenced $d_1$,$d_2$,$d_3$,$d_4$, whilst the other unreferenced elements can easily be deduced from the previous drawings.

Reference has been made hereinbefore to constructions including four active elements, but it is obvious that these examples are in no way limitative and the number of elements can be higher or lower than this number without passing beyond the scope of the invention.

Figure 8:
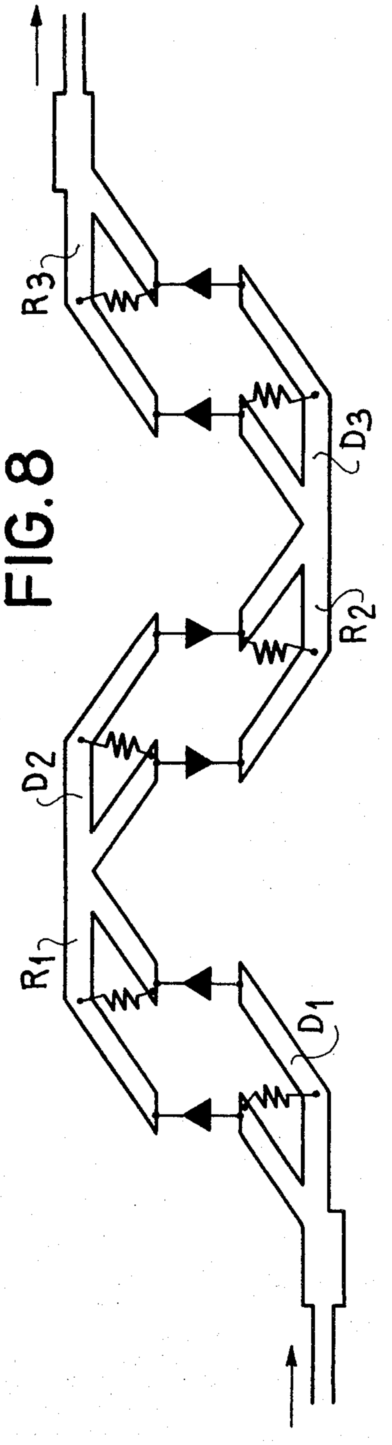
FIG. 8 an exemplified use of the distributor according to the invention in a multistage amplifier.

Another application of the distributor according to the invention consists of the repeated use of series-connected dividers and recombiners $D_1$,$R_1$ $D_2$ . . . $R_3$. FIG. 8 shows a particularly simple example in which each of the dividers and recombiners only has two branches and in which each recombiner and the following divider are directly interconnected. The example shows a three-stage amplifier with in each case two transistors. The decibel gain is multiplied by the number of stages between the input and the output (arrows). An advantage of the structure shown is to reduce to the minimum the necessary impedance transformations.

Figure 9:
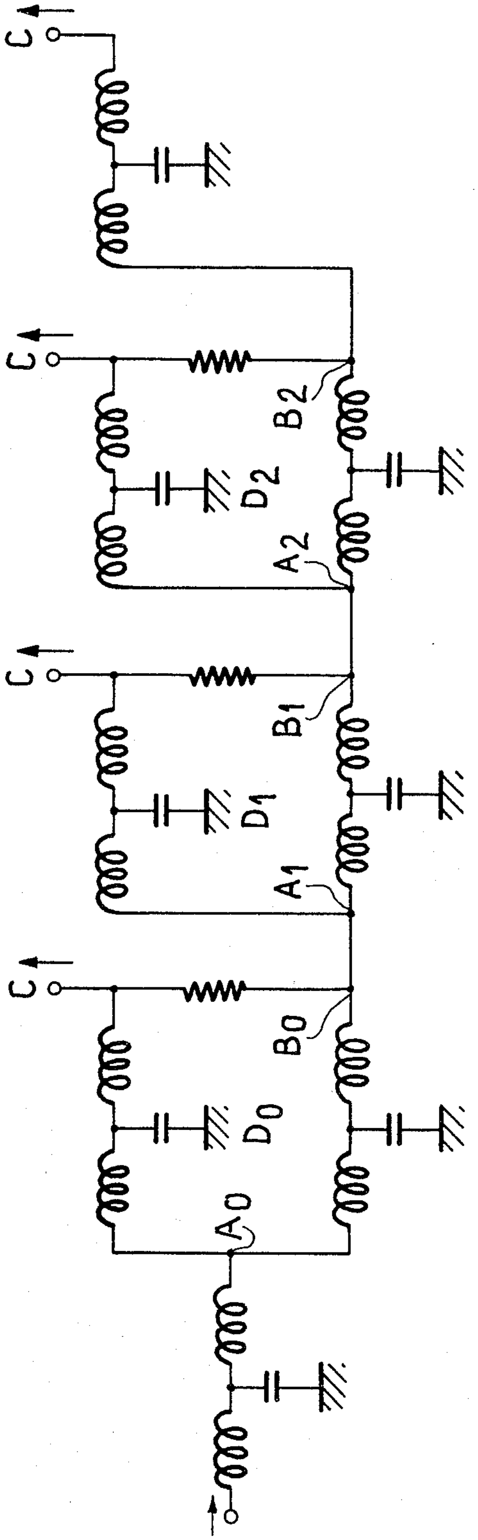
FIG. 9 a diagrammatic view of another embodiment of the distributor according to the invention.

In the exemplified embodiments of the solid state construction of the distributor according to the invention referred to hereinbefore, lines have been shown in the form of bands deposited on a substrate. It should be noted that within the scope of the invention, these lines could be replaced by cells with localized elements (self-inductances and capacitances) of the band pass, low pass or high pass type, as shown in FIG. 9 where these elements have not been given references. However, FIG. 9 does show the references necessary to illustrate the correspondence thereof with the diagram of FIG. 2. Each of the cells is one of the dividers of this figure. The part of the drawing to the left of point $A_o$ is used for impedance matching, whilst that to the right of point $B_2$ is a terminal line. All the secondary lines are designated by the same letter C.

In a hybrid form, the active elements are diodes or transistors connected to the substrate. Within the scope of the invention, said elements can be integrated into the substrate.

The invention also covers the case of constructions by conventional means, other than those in the solid state, both as regards the active elements and as regards the transmission elements.

What is claimed is:

1. A radio power distributor, comprising (a) a plurality of dividers (FIG. 2; D(i−1); D(i)), each having an input (A(i−1); A(i)), and a plurality of outputs (B(i−1), $C_1$(i−1), $C_2$(i−1), $C_m$(i−1); B(i), $C_1$(i), $C_2$(i), $C_m$(i));

(b) said dividers being connected in cascade with one output of one divider (B(i−1) of D(i−1)) connected to the input of the next divider (A(i) of D(i));

(c) a plurality of dissipative elements (between a–b, a–c, a–d);

(d) each of the other outputs ($C_1$(i−1), $C_2$(i−1), $C_m$(i−1) of said one divider D(i−1)) being connected by a different one of said dissipative elements to said one output (B(i−1) of said one divider D(i−1)); and (e) each of said other outputs ($C_1$(i−1), $C_2$(i−1), $C_m$(i−1) of said one divider D(i−1)) being adopted to be connected to a load.

2. A circuit for radio power distribution, i.e., for the division of radio frequency power between a primary branch (A(i−1), a(i)) and several secondary branches (B(i−1), $C_1$(i−1), $$\frac{\ldots C(i-1)}{m};$$

B(i), $C_1$(i) . . . $C_m$(i)); or for the recombination of radio frequency power adopted to arrive at said several branches (B(i), $C_1$(i) . . . $C_m$(i)) into said primary branch (A(i)), at a given operating frequency band, comprising a plurality of dividers (D(i−1), D(i)), each having a single primary branch (A(i), A(i−1)) and a plurality of secondary branches (B(i−1), $C_1$(i−1) . . . $C_m$(i−1) . . . $C_m$(i−1); B(i), $C_1$(i), . . . $C_m$(i)); the dividers (D(i−1), D(i)) being arranged in cascade, with one secondary branch, called the main secondary branch (B(i−1)) of a divider (D(i−1)) being connected to the primary branch (A(i)) of the following divider (D(i)) and wherein the other secondary branches ($C_1$(i−1), . . . $D_m$(i−1) are each connected by a dissipative element (between a–b; a–c; a–d) to a common point (a) of the main secondary branch (B(i−1), the circuit providing the division of a radio power when said power is applied to the primary branch (A(i−1)) of a first power divider (D(i−1)) into smaller powers which are adapted to be collected in loads of the other secondary branches $C_1$(i−1), . . . $C_m$(i−1); and providing the recombination of powers, when said powers are applied to the secondary branches, into a combination larger power collected in the primary branch of a final divider one of the plurality of dividers.

3. A radio power distributor according to claim 2, wherein a phase changer (0(i−1), 0(i)) is connected in the primary branch (A(i−1), A(i)) of at least one of the dividers (D(i−1), D(i)).

4. A radio power distributor according to claim 2, included in a radio device for the recombination of power of n generators (FIG. 5: $T_1$, $T_2$, $T_3$, $T_4$) incorporating n−1 dividers (D'(i=3), D'(i=2), D'(i=3)) with two secondary branches ((11, 71); (21, 61); (31, 51)), the first divider (D'(i=3)) having one (51) of its secondary branches connected to one of the generators ($T_1$) across a phase changer (41) (FIG. 5, upper half).

5. A radio power distributor according to claim 2 included in a radio device for dividing a power into n partial powers, having n−1 dividers (FIG. 5 D(i=1); D(i=2); D(i=3) with two secondary branches ((1, 7); (2, 6); (3, 5)), one (5) of the secondary branches of the final divider (4 of D(i=3)) being connected to one ($T_4$) of the loads ($T_1$, $T_2$, $T_3$, $T_4$) across a phase generator (4) (FIG. 5, lower half).

6. A radio power circuit according to claim 2 included in a radio device for dividing the power of a source into partial powers and supplying the input to n loads which are amplifiers ($T_1$, $T_2$, $T_3$, $T_4$) and for recombining the output powers of these n amplifiers ($T_1$, $T_2$, $T_3$, $T_4$), comprising a first distributor (I) having n−1 dividers (D(i=1); D(i=2); D(i=3)), with two secondary branches ((1, 7); (2, 6); (3, 5)), one of the secondary branches (5) of the final divider (D(i=3)) being connected to one load ($T_4$) across a phase generator (4), the loads being amplifiers ($T_1$, $T_2$, $T_3$, $T_4$); said circuit further comprising a second distributor (II) incorporating n−1 dividers (D'(i=3); D'(i=2); D'(i=1) each with two secondary branches ((31, 51); (21, 61); (11, 71)), the first divider (D'(i=3)) having one of its secondary branches (51) connected to one generator ($T_1$) across a phase changer (41), the generators being constituted by the output of these amplifiers ($T_1$, $T_2$, $T_3$, $T_4$).

7. A radio power distributor according to claim 4, particularly for ultra-high frequencies comprising microband technology using linear conductors placed on one of the faces of an insulating substrate, whose other face is coated with metal, wherein the dividers comprise aligned U-shaped conductors, the bottom of a U being positioned level with the end of the branches of the following U and its lower branch (31, 21, 71) in the extension of the upper branch (81, 11, 61) of the latter and in contact therewith, said branches (31, 21, 71) having a length substantially equal to a quarter wave length corresponding to the center operating frequency and wherein the upper branch (51) of the first divider extends from a line (41) whose length is substantially equal to a quarter said wave length (FIGS. 5, and 8).

8. A radio power distributor according to claim 5, particularly for ultra-high frequencies comprising microband technology using linear conductors placed on one of the faces of an insulating substrate, whose other face is coated with metal, wherein the dividers comprise aligned U-shaped conductors, the bottom of a U being positioned level with the end of the branches of the preceding U and its upper branch (1, 2, 3) in the extension of the lower branch (8, 7, 6) of the latter and in contact therewith, said branches (1, 2, 3) having a length substantially equal to a quarter wave length corresponding to the center operating frequency and wherein the lower branch (5) of the last divider (D(i=3)) is extended by a terminal line (4) whose length is substantially equal to a quarter said wave length (FIGS. 5, and 8).

9. A radio power distributor according to claim 4 comprising in each divider an impedance transformer on the secondary branch different from the main secondary branch.

10. A radio power distributor according to claim 7 comprising supplementary linear conductors arranged parallel to the upper branches (1, 2, 3) of the U and of the terminal line (4) and in the vicinity thereof, constituting with them impedance transformers thereof and wherein the loads ($T_1$, $T_2$, $T_3$, $T_4$) are connected to these supplementary conductors at the end of the branches of the U and the end of the terminal line.

11. A radio power distributor according to claim 5 comprising in each divider an impedance transformer on the secondary branch different from the main secondary branch.

12. A radio power distributor according to claim 8 comprising supplementary linear conductors arranged parallel to the upper branches (1, 2, 3) of the U and of the terminal line (4) and in the vicinity thereof, constituting with them impedance transformers thereof and wherein the loads ($T_1$, $T_2$, $T_3$, $T_4$) are connected to these supplementary conductors at the end of the branches of the U and the end of the terminal line.

13. A radio power distributor, comprising (a) a plurality of dividers (D(i−1); D(i)), each having a plurality of inputs and an output;

(b) said dividers being connected in cascade with the output of one divider connected to one of the inputs of the next divider;

(c) a plurality of dissipative elements;

(d) each of the other inputs of said one divider being connected by a different one of said dissipative elements to said one input of said one divider; and (e) each of said other inputs of said one divider being adapted to be connected to a source.

* * * * *